United States Patent [19]
Yamana

[11] Patent Number: 6,090,522
[45] Date of Patent: Jul. 18, 2000

[54] CHEMICAL AMPLIFICATION PHOTORESIST COMPRISING A REVERSE REACTION INHIBITOR

[75] Inventor: Mitsuharu Yamana, Tokyo, Japan

[73] Assignee: NEC Corporation, Tokyo, Japan

[21] Appl. No.: 09/332,729

[22] Filed: Jun. 14, 1999

[30] Foreign Application Priority Data

Jun. 18, 1998 [JP] Japan .................................. 10-171558

[51] Int. Cl.⁷ .................................................... G03F 7/039
[52] U.S. Cl. ........................................................ 430/270.1
[58] Field of Search ........................................ 430/270.1

[56] References Cited

U.S. PATENT DOCUMENTS 4,491,628  1/1985  Ito et al. ................................. 430/176

FOREIGN PATENT DOCUMENTS 2-27660  6/1990  Japan .

OTHER PUBLICATIONS

"Effects of Deprotected Species on Chemically Amplified Resist Systems", Ota, T. et al., SPIE, 2195, Feb.–Mar. 1994, 74–83.

"Chemical Amplification Positive Deep UV Resist Using Partially Tetrahydropyranyl–Protected Polyvinylphenol", by Takashi Hattori, et al., SPIE, vol. 1925, pp. 146–154, 1993.

"Time delay effect on a posiitve deep UV resist using partially tetrahydropyranyl–protected polyvinylphenol", by Takashi Hattori, et al., Journal of Photopolymer Science and Technology, vol. 6, No. 4, (1993), pp. 497–504.

*Primary Examiner*—Janet Baxter
*Assistant Examiner*—Rosemary Ashton
*Attorney, Agent, or Firm*—Scully, Scott, Murphy & Presser

[57] ABSTRACT

The inhibition of reverse reactions of a protecting group elimination reaction, to thereby increase the dissolution contrast and resolution, is considered. The disclosed chemical amplification photoresist includes a base resin which is insoluble in a basic developer in the state in which a protecting group is attached to a predetermined site thereof but is soluble in the basic developer in the state in which the protecting group is eliminated therefrom, a photochemical acid generator which generates a hydrogen ion upon exposure to light, and a reverse reaction inhibitor. The reaction of a hydrogen ion generated by the photochemical acid generator with the base resin eliminates the protecting group, which renders the base resin soluble in the basic developer, with concomitant generation of a new hydrogen ion, so that solubilization of the photoresist in the basic developer is amplified. The reverse reaction inhibitor inhibits recombination of the eliminated protecting group with the base resin.

7 Claims, 1 Drawing Sheet

CHEMICAL AMPLIFICATION PHOTORESIST COMPRISING A REVERSE REACTION INHIBITOR

BACKGROUND OF THE INVENTION

1. Field of the Invention

This invention relates to a chemical amplification photoresist for use in a photolithography step in the production of a semiconductor device such as an LSI and more particularly to a positive-type chemical amplification photoresist which becomes soluble in a basic developer upon exposure to light.

This application is based on Japanese Patent Application No. Hei 10-171558, the content of which is incorporated herein by reference.

2. Description of Related Art

In photolithography using chemical amplification photoresist for the production of semiconductor devices, the g-line (wavelength: 436 nm) and i-line (wavelength: 365 nm) of high pressure mercury lamps have heretofore been used as an exposure light source together with a novolak type resin as a photoresist for forming a resist mask on a semiconductor substrate.

However, with the development of more highly integrated LSI devices, exposure utilizing far ultraviolet rays such as excimer laser beams (wavelengths: 248 nm, 193 nm), which is more advantageous than exposure with the g-line or i-line as a light source, has been considered more desirable.

On the other hand, the use of a KrF excimer laser as a light source causes the problem that novolak photoresists, which strongly absorb far ultraviolet rays, produce no acceptable resist pattern.

Accordingly, in order to solve this problem, a chemical amplification photoresist as described in Japanese Patent Application, Second Publication (Kokoku) No. Hei 2-27660, has been proposed. The chemical amplification photoresist is a positive-type photoresist utilizing an acid-catalyzed reaction, comprising a base resin, such as polyhydroxystyrene, which is alkali-insoluble in the state in which a protecting group is attached to a predetermined site of the base resin but is alkali-soluble in the state in which the protecting group is eliminated therefrom, a photochemical acid generator which generates hydrogen ions upon exposure to light, a small amount of additive for adjusting the performance, and an organic solvent used as a diluent for spinner coating.

After coating the chemical amplification photoresist on a semiconductor substrate and drying and solidifying it, irradiation of far ultraviolet rays from an excimer laser light source to the resulting photoresist film on the semiconductor substrate results in generation of hydrogen ions (acid), which is an initiator species for chemical amplification, by the photochemical acid generator. The hydrogen ion substitutes for a protecting group attached to the base resin to release the protecting group in the process of heat treatment (PEB: Post Exposure Bake) carried out subsequently to the exposure, thereby changing the photoresist from alkali-insoluble to alkali-soluble, with concomitant generation of a by-produced hydrogen ion, which allows the reaction of eliminating the protecting groups from the base resin to proceed like a chain reaction. This reaction, which is called an acid-catalyzed sensitization reaction, increases the dissolution selectivity of photoresist so that highly sensitive photosensitive properties can be achieved. Therefore, development of the photoresist after exposure with an alkaline developer results in a desired fine resist pattern. (cf. Hattori et al., "Proceedings of SPIE" Mar. 1, 1993 p.149 Line 33 Schemel & Hattori et al., "Journal of Photopolymer Science and Technology" Jun. 23, 1993 p. 503 Line 2 Scheme 1).

In the initial stage of development of the positive-type chemical amplification photoresist, a tert-butoxycarbonyl group represented by the following Chemical Formula 1 was used as a protecting group.

Chemical Formula 1

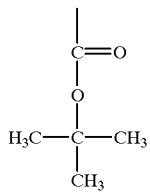

In the protecting group elimination reaction in this case, tert-butoxycarbonyl-protected polyhydroxystyrene, $(CH_2CH)_y(C_6H_4OH)(CH_2CH)_{1-y}\{C_6H_4OC(O)OC(CH_3)_3\}$, and a hydrogen ion generated from the photochemical acid generator react with each other to generate polyhydroxystyrene, isobutylene $(C(CH_3)_2CH_2)$, carbon dioxide, and a hydrogen ion as illustrated in Chemical Formula 2 below. On this occasion, since isobutylene, the product of the protecting group elimination reaction, has a low boiling point (−6.9° C.), it is evaporated, and does not remain in the photoresist. Therefore, no reverse reaction of the protecting group elimination reaction occurs.

Chemical Formula 2 tert-Butoxycarbonyl-protected polyhydroxystyrene

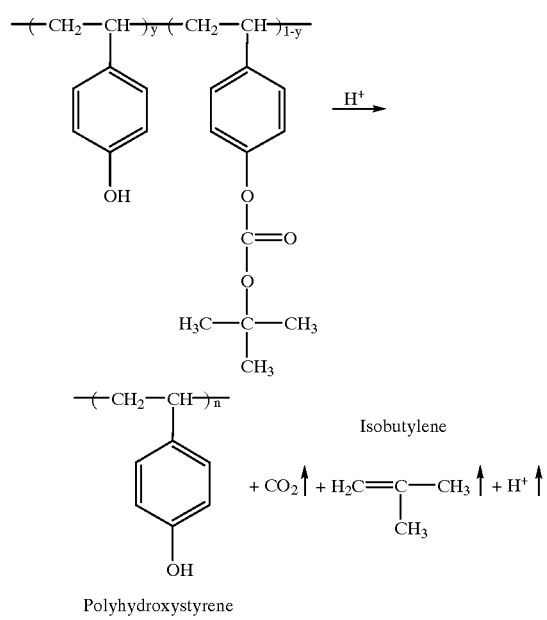

However, the chemical amplification photoresist comprising the tert-butoxycarbonyl-protected resin has the defect that the shape of the resist pattern tends to be deteriorated if heat treatment is not carried out immediately after the exposure, i.e., it has a poor standing stability. In other words, it has the defect that the photoresist without heat treatment immediately after the exposure absorbs ammonia in the atmosphere and the ammonia causes a neutralization reaction with the hydrogen ion existing in the photoresist and heat treatment thereafter will not allow the elimination of protecting groups so that the resist remains insoluble in a developer, which results in the deterioration of the resist pattern.

On the contrary, Hattori et al. found that use of an acetal-based chemical group such as a tetrahydropyranyl group as a protecting group increases the standing stability of the resist.

On this occasion, in the protecting group elimination reaction, tetrahydropyranyl-protected polyhydroxystyrene, $(CH_2CH)_y(C_6H_4OH)_{1-y}(C_6H_4OC_5H_4O)$, and hydrogen ion generated by the photochemical acid generator upon irradiation with far ultraviolet rays react with each other to produce polyhydroxystyrene and tetrahydropyran (intermediate), $(C_5H_4O)^+$ as illustrated in the following Chemical Formula 3.

Chemical Formula 3

Tetrahydropyranyl-protected polyhydroxystyrene

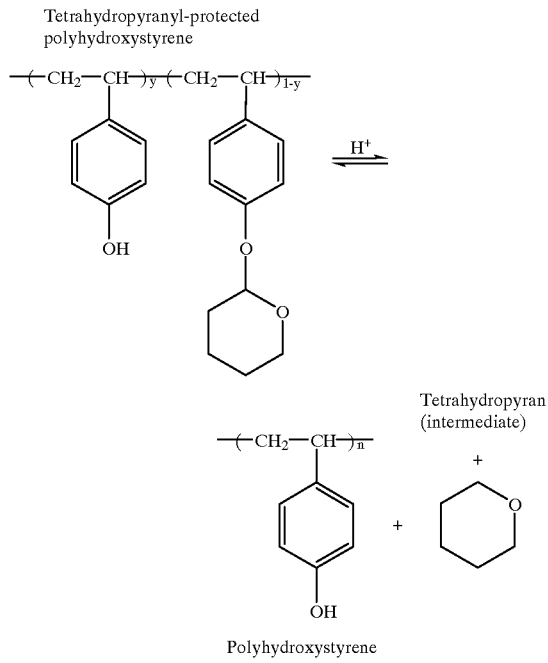

Polyhydroxystyrene

However, although the photoresist comprising the conventional tetrahydropyranyl-protected resin has the advantage that it is excellent in standing stability, it has the defect that it has a low dissolution contrast (in other words, the ratio of the dissolution speed of exposed portions to non-exposed portions of the photoresist) so that the photoresist has poor resolution. This is because tetrahydropyran (an intermediate) produced during the protecting group elimination reaction does not evaporate (boiling point: 88° C.) and remains in the photoresist to thereby allow a reverse reaction to proceed in which tetrahydropyran reacts with polyhydroxystyrene, so that the protecting group elimination reaction in this case is an equilibrium reaction.

FIG. 1 is a graph illustrating the PEB time dependence of protecting group content in a conventional chemical amplification photoresist. As illustrated in FIG. 1, it can be seen from the variation of the protecting group content with the passage of the PEB time that the tetrahydropyranyl group gives earlier saturation than the tert-butoxycarbonyl group (t-BOC group) so that the protecting group elimination reaction does not proceed sufficiently in the chemical amplification photoresist having a tetrahydropyranyl group.

BRIEF SUMMARY OF THE INVENTION

The object of the present invention, which has been made in view of the above, is to provide a chemical amplification photoresist which not only has an acceptable standing stability but also can inhibit reverse reactions of the protecting group elimination reaction.

To solve the above-described problems, this invention provides a chemical amplification photoresist comprising a base resin which is insoluble in a basic developer in the state in which a protecting group is attached to a predetermined site thereof but is soluble in the basic developer in the state in which the protecting group is eliminated therefrom and a photochemical acid generator which generates a hydrogen ion upon exposure to light, wherein the reaction of a hydrogen ion generated by the photochemical acid generator with the base resin eliminates the protecting group, thus rendering the base resin soluble in the basic developer, with the concomitant generation of a new hydrogen ion, whereby solubilization of the photoresist in the basic developer is amplified, the photoresist further comprising a reverse reaction inhibitor which inhibits recombination of the eliminated protecting group with the base resin.

As a result of the constitution of this invention, not only is the standing stability excellent, but also reverse reactions of the protecting group elimination reaction can be inhibited so that a photoresist pattern having high dissolution contrast and high resolution can be obtained. Good reproducibility is obtained and even fine patterns retain squareness.

DETAILED DESCRIPTION OF THE INVENTION

Figure 1:
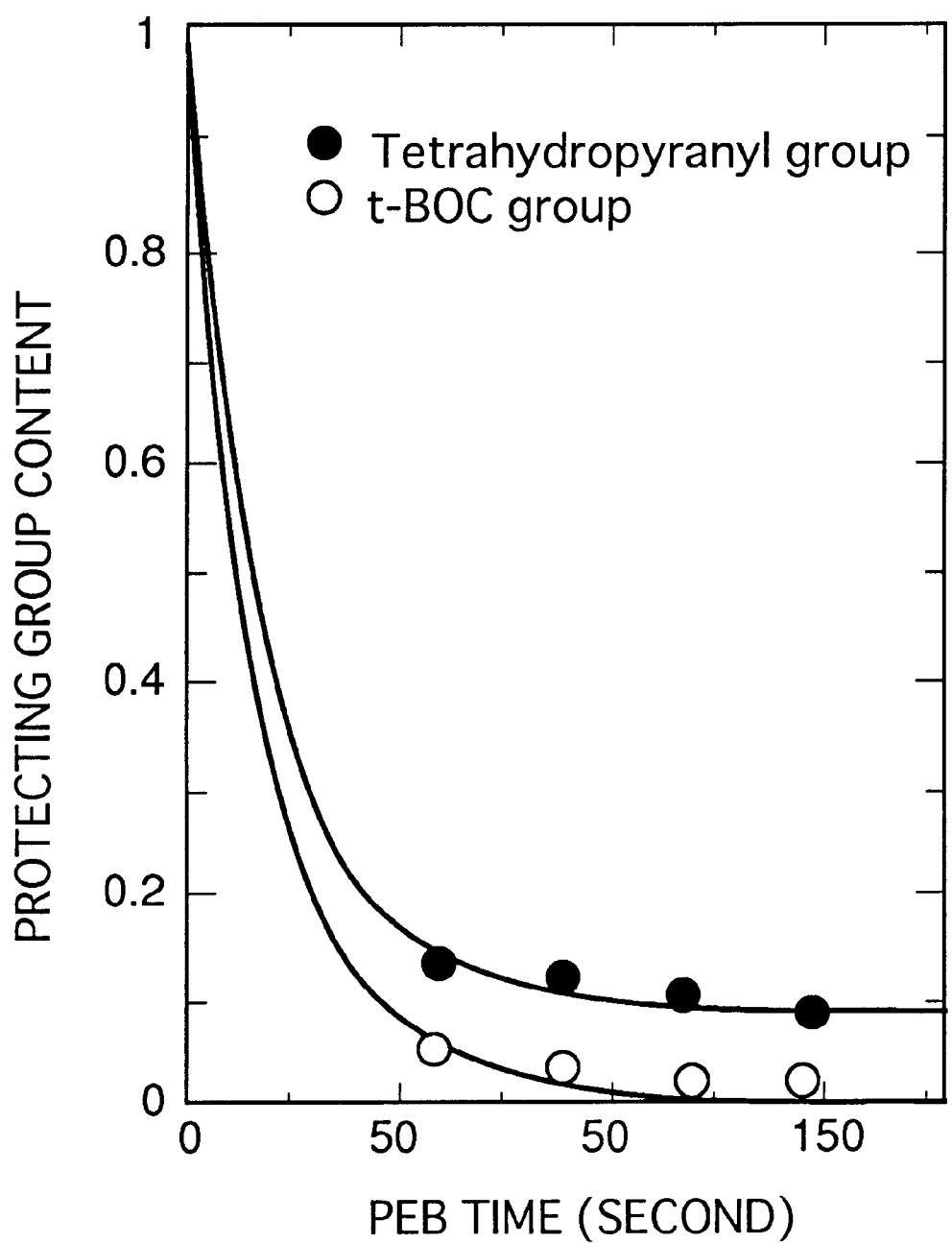
FIG. 1 is a graph illustrating the PEB dependence of protecting group content in a conventional chemical amplification photoresist.

In the chemical photoresist of this invention, a polyhydroxystyrene resin may be used as the base resin.

In the chemical photoresist of this invention, the protecting group may be an acetal-based protecting group.

The acetal-based protecting group may be a tetrahydropyranyl group.

In the chemical photoresist of this invention, the reverse reaction inhibitor may be one containing at least an alkyl halide.

As the alkyl halide, a member selected from the group consisting of an alkyl fluorosulfonate, an alkyl bromosulfonate and an alkyl iodosulfonate, each having a molecular weight of 100 to 1,000, or mixtures of two or more of them can be used.

The content of the alkyl halide is 1 to 20 wt % based on the base resin.

Hereafter, embodiments of this invention will be explained. The explanation will be made concretely by examples.

First Example

The positive-type chemical amplification photoresist of this example is a positive-type photoresist utilizing an acid-catalyzed sensitization reaction, comprising a base resin which is insoluble in a basic developer in the state in which a protecting group is attached to a predetermined site thereof but is soluble in the basic developer in the state in which the protecting group is eliminated therefrom, a photochemical acid generator which generates a hydrogen ion upon exposure to light, and a reverse reaction inhibitor which inhibits recombination of the eliminated protecting group with the base resin. The photoresist optionally contains a small amount of additive for adjusting the performance as needed and its viscosity is adjusted with an organic solvent (diluent) for adjusting the thickness of a spinner coated film.

The base resin is a polyhydroxystyrene resin (Chemical Formula 4 below) and the reverse reaction inhibitor comprises p-toluenesulfonyl fluoride, $CH_3C_6H_4SO_2F$, having a molecular weight of 100 to 1,000, which is added in an amount of approximately 5 wt % based on the base resin.

In this example, the base resin is selected to have a molecular weight of 100 to 1,000 since even the monomer of base resin has a molecular weight of about 100 and with a molecular weight above 1,000, the base resin will not dissolve in the organic solvent (diluent).

Chemical Formula 4

Tetrahydropyranyl-protected polyhydroxystyrene

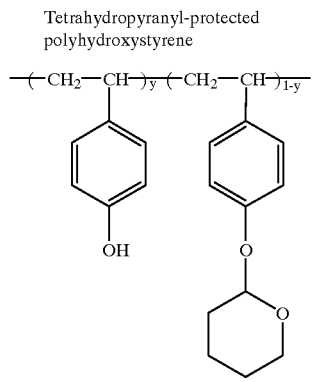

Next, the operation of the chemical amplification photoresist will be explained.

When a film on a semiconductor substrate, which has been obtained by spinner coating the chemical amplification photoresist on a semiconductor substrate such as a silicon substrate and then drying and solidifying it, is exposed to far ultraviolet rays from a KrF excimer laser as a light source through a reticule or photomask having formed thereon a predetermined semiconductor integrated circuit pattern, hydrogen ions, which serve as an initiator species for chemical amplification, are generated by the photochemical acid generator in an exposed region of the photoresist film. After completion of the exposure, the semiconductor with a photoresist film is immediately subjected to heat treatment (PEB treatment) by allowing it to stand in an atmosphere at approximately 100° C. for approximately 90 seconds.

Upon the PEB treatment, the tetrahydropyranyl-protected polyhydroxystyrene and the hydrogen ion generated by the photochemical acid generator react with each other to produce polyhydroxystyrene and tetrahydropyran (intermediate) as illustrated by Chemical Formula 5 below. The produced tetrahydropyran (intermediate) reacts with water which remains in the photoresist as an impurity, and is converted into hydroxytetrahydropyran.

Chemical Formula 5

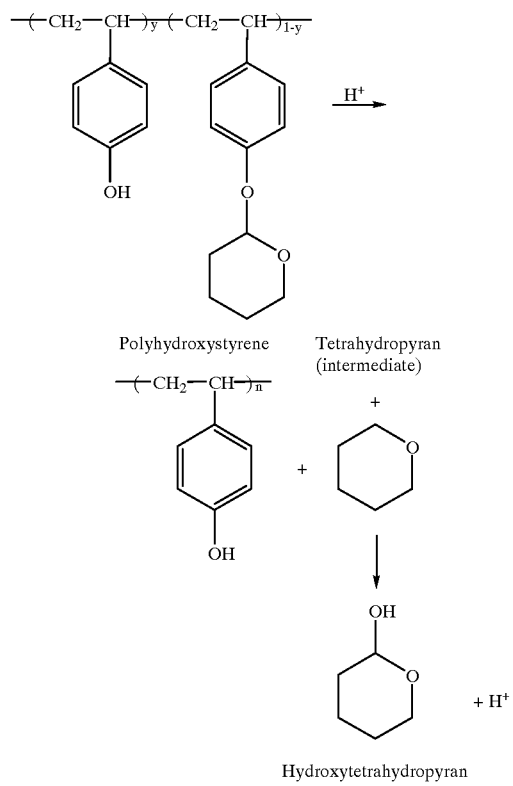

The hydroxytetrahydropyran reacts with p-toluenesulfonyl fluoride, $CH_3C_6H_4SO_2F$, serving as a reverse reaction inhibitor to produce tetrahydropyranyl toluenesulfonate, $C_6H_4(SO_3C_5H_4O)CH_3$, a hydrogen ion, and a fluoride ion as illustrated in Chemical Formula 6 below.

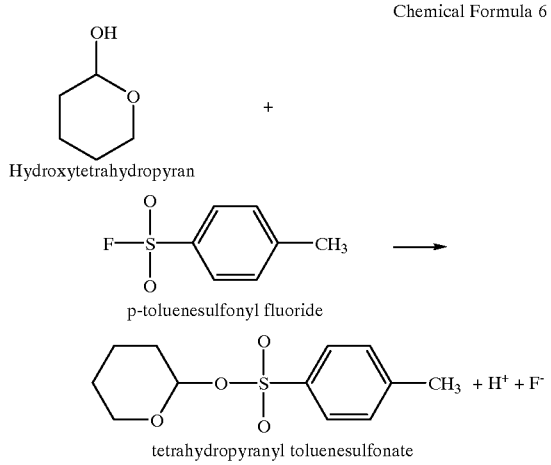

The hydrogen ion produced in the reaction process illustrated in Chemical Formula 6 reacts with tetrahydropyranyl-protected polyhydroxystyrene to produce polyhydroxystyrene and tetrahydropyran (intermediate) (Chemical Formula 5). In short, the protecting group elimination reaction proceeds like a chain reaction but the recombination (Chemical Formula 3) of polyhydroxystyrene with tetrahydropyran (intermediate) is inhibited by the action of a reverse reaction inhibitor (Chemical Formula 6).

The PEB treatment changes the base resin of which the protecting group has been eliminated therefrom to be soluble in an alkaline developer and hence subsequent development with an alkaline developer results in formation of a predetermined resist pattern.

As described above, in the PEB treatment for the chemical amplification photoresist of this example, the tetrahydropyranyl group (protecting group), eliminated by the reaction between the tetrahydropyranyl-protected polyhydroxystyrene resin and hydrogen ion, reacts with the water which remains in the photoresist as an impurity, and is converted to hydroxytetrahydropyran, which then reacts with p-toluenesulfonyl fluoride (reverse reaction inhibitor) to form tetrahydropyranyl toluenesulfonate (Chemical Formula 6), so that the eliminated tetrahydropyranyl group will by no means be recombined with the polyhydroxystyrene resin.

Therefore, according to the constitution of this example, not only is the standing stability excellent, but also the reverse reaction as illustrated in Chemical Formula 3, which is s problem in the conventional art, can be inhibited, so that a photoresist pattern having high dissolution contrast and high resolution can be realized. Moreover, good reproducibility is obtained and even fine patters retain squareness.

Next, the photoresist of the above-described constitution and the same photoresist as above, except lacking the reverse reaction inhibitor (i.e., a conventional photoresist), were coated on respective semiconductor substrates under the same coating conditions to form two types of photoresist film. The resultant photoresist films were pattern-wise exposed under the same exposure conditions using a KrF excimer laser stepper (Lens NA: 0.55), subjected to PEB treatment, and then developed. The conventional photoresist showed a dissolution contrast of 8 and a resolution of 0.30 μm, whereas the photoresist of this example showed an increase in dissolution contrast to 12 and in resolution to 0.25 μm. Also, the photoresist of this example was confirmed to have a focal depth and a dimensional depth both of which are improved by approximately 10% or more as compared with the conventional photoresist.

Second Example

A major difference between the chemical amplification photoresist of this example and the one of the First Example above is that the reverse reaction inhibitor used in the former is p-toluenesulfonyl chloride, $CH_3C_6H_4SO_2Cl$, instead of p-toluenesulfonyl fluoride as used in the latter. A reverse reaction inhibitor having a molecular weight of 100 to 1,000 is added in an amount of approximately 5 wt % based on the base resin, the addition being similar to the First Example.

Next, the operation of the chemical amplification photoresist of this example will be explained.

When a film on a semiconductor substrate, which has been obtained by spinner coating the chemical amplification photoresist on a semiconductor substrate such as a silicon substrate and then drying and solidifying it, is exposed to far ultraviolet rays from a KrF excimer laser as a light source through a reticule or photomask having formed thereon a predetermined semiconductor integrated circuit pattern, hydrogen ions, which serve as an initiator species for chemical amplification, are generated by the photochemical acid generator in an exposed region of the photoresist film.

Upon PEB treatment, the tetrahydropyranyl-protected polyhydroxystyrene and the hydrogen ion generated by the photochemical acid generator react with each other to produce polyhydroxystyrene and tetrahydropyran (intermediate) as illustrated by Chemical Formula 5 above. The produced tetrahydropyran (intermediate) reacts with water which remains in the photoresist as an impurity, and is converted into hydroxytetrahydropyran. The hydroxytetrahydropyran reacts with p-toluenesulfonyl chloride, $CH_3C_6H_4SO_2Cl$, serving as a reverse reaction inhibitor to produce tetrahydropyranyl toluenesulfonate, $C_6H_4(SO_3C_5H_4O)CH_3$, a hydrogen ion, and a chloride ion as illustrated in Chemical Formula 7 below.

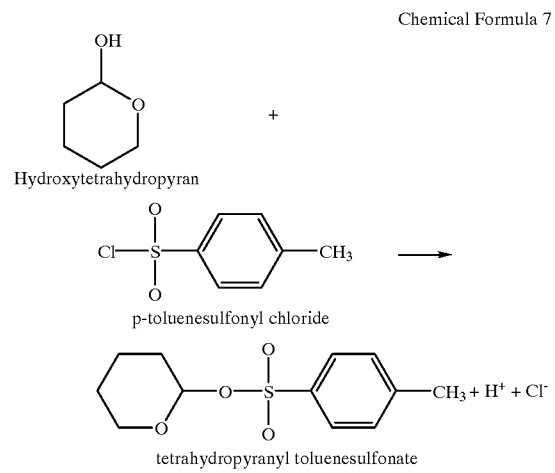

Chemical Formula 7

The hydrogen ion produced in the reaction process illustrated in Chemical Formula 7 reacts with tetrahydropyranyl-protected polyhydroxystyrene to produce polyhydroxystyrene and tetrahydropyran (intermediate) (Chemical Formula 5). In short, the protecting group elimination reaction proceeds like a chain reaction but the recombination (Chemical Formula 3) of polyhydroxystyrene with tetrahydropyran (intermediate) is inhibited by the action of a reverse reaction inhibitor (Chemical Formula 7).

The PEB treatment changes the base resin of which the protecting group has been eliminated therefrom to be soluble in an alkaline developer and hence subsequent development with an alkaline developer results in formation of a predetermined resist pattern.

As described above, in the PEB treatment for the chemical amplification photoresist of this example, the tetrahydropyranyl group (protecting group), eliminated by the reaction between the tetrahydropyranyl-protected polyhydroxystyrene resin and hydrogen ion, reacts with the water which remains in the photoresist as an impurity, and is converted to hydroxytetrahydropyran, which then reacts with p-toluenesulfonyl chloride (reverse reaction inhibitor) to form tetrahydropyranyl toluenesulfonate (Chemical Formula 7) so that the eliminated tetrahydropyranyl group will by no means be recombined with the polyhydroxystyrene resin.

Therefore, also according to the constitution of this example, approximately the same effects as described in the First Example above can be obtained. That is, since the reverse reaction as illustrated in Chemical Formula 3, which is the problem of the conventional art can be inhibited, a photoresist pattern which is excellent in standing stability and has high dissolution contrast and high resolution can be obtained.

Next, the photoresist of the above-described constitution and the same photoresist as above except for the reverse reaction inhibitor (i.e., a conventional photoresist) were coated on respective semiconductor substrates under the same coating conditions to form two types of photoresist film. The resultant photoresist films were pattern-wise exposed under the same exposure conditions using a KrF excimer laser stepper (Lens NA: 0.55), subjected to PEB treatment, and then developed. The conventional photoresist showed a dissolution contrast of 8 and a resolution of 0.30 µm, whereas the photoresist of this example showed an increase in dissolution contrast to 11 and in resolution to 0.26 µm. Also, the photoresist of this example was confirmed to have a focal depth and a dimensional depth both of which are improved by approximately 10% or more as compared with the conventional photoresist.

Third Example

A major difference between the chemical amplification photoresist of this example and the one of the First Example above is that the reverse reaction inhibitor used in the former is p-toluenesulfonyl bromide, $CH_3C_6H_4SO_2Br$, instead of p-toluenesulfonyl fluoride as used in the latter. A reverse reaction inhibitor having a molecular weight of 100 to 1,000 is added in an amount of approximately 5 wt % based on the base resin, the addition being similar to the First Example.

In the PEB treatment for the chemical amplification photoresist of this example, the tetrahydropyranyl group (protecting group), eliminated by the reaction between the tetrahydropyranyl-protected polyhydroxystyrene resin and hydrogen ion (Chemical Formula 5), reacts with the water which remains in the photoresist as an impurity, and is converted to hydroxytetrahydropyran, which then reacts with p-toluenesulfonyl bromide (reverse reaction inhibitor) to form tetrahydropyranyl toluenesulfonate (Chemical Formula 8), so that the eliminated tetrahydropyranyl group will by no means be recombined with the polyhydroxystyrene resin.

Chemical Formula 8

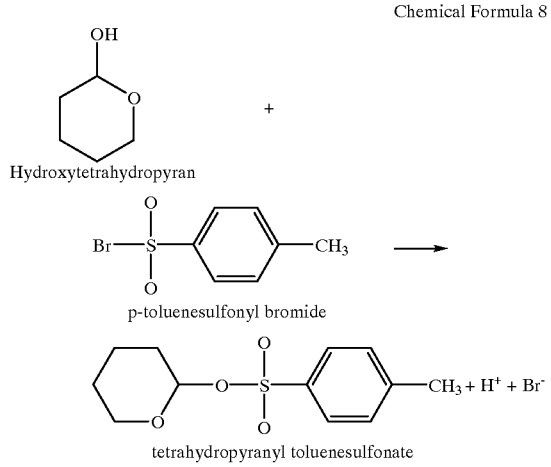

Therefore, also according to the constitution of the Third Example, approximately the same effects as described in the First Example and Second Example can be obtained. That is, a photoresist pattern which is excellent in standing stability and has high dissolution contrast and high resolution can be obtained.

Next, the photoresist of the above-described constitution and the same photoresist as above except for the reverse reaction inhibitor (i.e., a conventional photoresist) were coated on respective semiconductor substrates under the same coating conditions to form two types of photoresist film. The resultant photoresist films were pattern-wise exposed under the same exposure conditions using a KrF excimer laser stepper (Lens NA: 0.55), subjected to PEB treatment, and then developed. The conventional photoresist showed a dissolution contrast of 8 and a resolution of 0.30 µm, whereas the photoresist of this example showed an increase in dissolution contrast to 12 and in resolution to 0.25 µm. Also, the photoresist of this example was confirmed to have a focal depth and a dimensional depth both of which are improved by approximately 10% or more as compared with the conventional photoresist.

Fourth Example

A major difference between the chemical amplification photoresist of this example and the one of the First Example above is that the reverse reaction inhibitor used in the former is p-toluenesulfonyl iodide, $CH_3C_6H_4SO_2I$, instead of p-toluenesulfonyl fluoride as used in the latter. A reverse reaction inhibitor having a molecular weight of 100 to 1,000 is added in an amount of approximately 5 wt % based on the base resin, the addition being similar to the First Example.

In the PEB treatment for the chemical amplification photoresist of this example, the tetrahydropyranyl group (protecting group), eliminated by the reaction between the tetrahydropyranyl-protected polyhydroxystyrene resin and hydrogen ion (Chemical Formula 5), reacts with the water which remains in the photoresist as an impurity, and is converted to hydroxytetrahydropyran, which then reacts with p-toluenesulfonyl iodide (reverse reaction inhibitor) to form tetrahydropyranyl toluenesulfonate (Chemical Formula 9), so that the eliminated tetrahydropyranyl group will by no means be recombined with the polyhydroxystyrene resin.

Chemical Formula 9

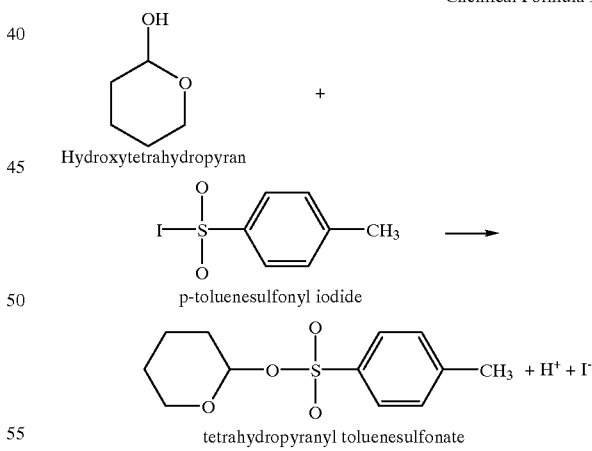

Therefore, also according to the constitution of the Fourth Example, approximately the same effects as described in the First Example to Third Example can be obtained. That is, a photoresist pattern which is excellent in standing stability and has high dissolution contrast and high resolution can be obtained.

Next, the photoresist of the above-described constitution and the same photoresist as above except for the reverse reaction inhibitor (i.e., a conventional photoresist) were coated on respective semiconductor substrates under the same coating conditions to form two types of photoresist film. The resultant photoresist films were pattern-wise exposed under the same exposure conditions using a KrF excimer laser stepper (Lens NA: 0.55), subjected to PEB treatment, and then developed. The conventional photoresist showed a dissolution contrast of 8 and a resolution of 0.30 µm, whereas the photoresist of this example showed an increase in dissolution contrast to 10 and in resolution to 0.26 µm. Also, the photoresist of this example was confirmed to have a focal depth and a dimensional depth both of which are improved by approximately 10% or more as compared with the conventional photoresist.

Having explained the examples of this invention as described in the foregoing, it should be noted that the specific constitutions are not limited to these examples, and this invention also includes various modifications of design that do not depart from the scope of the invention. For example, the exposure apparatus is not limited to a KrF excimer laser stepper apparatus. The irradiation is not limited to far ultraviolet rays.

Also, the base resin is not limited to polyhydroxystyrene resins, as long as it is insoluble in a basic developer in the state in which a protecting group is attached to a predetermined site thereof but is soluble in the basic developer in the state in which the protecting group is eliminated therefrom. The protecting group is preferably an acetal-based one such as a tetrahydropyranyl group but is not limited to acetal-based protecting groups. The reverse reaction inhibitor is preferably a sulfonic acid halide salt such as p-toluenesulfonic acid halide, but is not limited to sulfonic acid halide salts as long as it can inhibit the recombination of the eliminated protecting group with the base resin.

Furthermore, in the above-described Examples, the reverse reaction inhibitor was added in an amount of approximately 5 wt % but is not limited thereto and addition in amounts within the range of 1 to 20 wt % based on the base resin is effective. If the amount is less than 1 wt % based on the base resin, no inhibitory effect is obtained whereas an amount exceeding 20 wt % is undesirable since it decreases the heat resistance of photoresist.

What is claimed is:

1. A chemical amplification photoresist comprising a base resin which is insoluble in a basic developer in the state in which a protecting group is attached to a predetermined site thereof but is soluble in the basic developer in the state in which the protecting group is eliminated therefrom and a photochemical acid generator which generates a hydrogen ion upon exposure to light, wherein reaction of a hydrogen ion generated by the photochemical acid generator with the base resin eliminates the protecting group, thus rendering the base resin soluble in the basic developer, with concomitant generation of another hydrogen ion, whereby solubilization of the photoresist in the basic developer is amplified, the photoresist further comprising a reverse reaction inhibitor which inhibits recombination of the eliminated protecting group with the base resin.

2. The chemical amplification photoresist as claimed in claim 1, wherein the base resin is a polyhydroxystyrene resin.

3. The chemical amplification photoresist as claimed in claim 1, wherein the protecting group is an acetal-based protecting group.

4. The chemical amplification photoresist as claimed in claim 3, wherein the acetal-based protecting group is a tetrahydropyranyl group.

5. The chemical amplification photoresist as claimed in claim 1, wherein the reverse reaction inhibitor comprises at least sulfonic acid halide salt.

6. The chemical amplification photoresist as claimed in claim 5, wherein the sulfonic acid halide salt is a member selected from the group consisting of an alkyl sulfonic acid fluoride salt, a sulfonic acid bromide salt and a sulfonic acid iodide salt, each having a molecular weight of 100 to 1,000, or mixtures of two or more of them.

7. The chemical amplification photoresist as claimed in claim 5, wherein the sulfonic acid halide salt is contained in an amount of 1 to 20 wt % based on the base resin.

* * * * *